(12) United States Patent
Mori

(10) Patent No.: US 11,387,129 B2
(45) Date of Patent: Jul. 12, 2022

(54) SUBSTRATE WAREHOUSE, SUBSTRATE PROCESSING SYSTEM, AND SUBSTRATE INSPECTION METHOD

(71) Applicant: Tokyo Electron Limited, Tokyo (JP)

(72) Inventor: Takuya Mori, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 217 days.

(21) Appl. No.: 16/586,137

(22) Filed: Sep. 27, 2019

(65) Prior Publication Data

US 2020/0111694 A1    Apr. 9, 2020

(30) Foreign Application Priority Data

Oct. 5, 2018   (JP) .............................. JP2018-189707

(51) Int. Cl.
*H01L 21/677*  (2006.01)
*H01L 21/67*  (2006.01)
(Continued)

(52) U.S. Cl.
CPC ...... *H01L 21/67769* (2013.01); *B65G 1/1373* (2013.01); *H01L 21/67265* (2013.01); *H01L 21/67778* (2013.01); *B08B 1/00* (2013.01); *B65G 1/04* (2013.01); *B65G 2201/0297* (2013.01); *H01L 21/0209* (2013.01); *H01L 21/02087* (2013.01)

(58) Field of Classification Search
CPC ......... H01L 21/67769; H01L 21/67778; H01L 21/67265; H01L 21/02087; H01L 21/0209; H01L 21/67219; H01L 21/67242; B65G 2201/0297

See application file for complete search history.

(56) References Cited

U.S. PATENT DOCUMENTS 5,363,867 A * 11/1994  Kawano .................. B08B 9/093
                                                          134/95.2
8,348,584 B2 *  1/2013  Mizokawa ........ H01L 21/67772
                                                          414/225.01
(Continued)

FOREIGN PATENT DOCUMENTS

JP         5590118 B2     9/2014
KR       2009064114   *   6/2009
(Continued)

*Primary Examiner* — Jarrett J Stark
(74) *Attorney, Agent, or Firm* — Posz Law Group, PLC

(57) ABSTRACT

A substrate warehouse stores a container housing a substrate, and includes a transfer-in part which allows the container to be mounted thereon when the container is transferred-in from an outside; a transfer-out part which allows the container to be mounted thereon when the container is transferred-out to the outside; and a standby part which allows the container standing by for transfer-out to the outside to be mounted thereon. Also included is a functional part including an inspection that performs processing of inspecting the substrate; a delivery part which allows the container to be mounted thereon when delivering the substrate between the functional part and the container; a container transfer mechanism which transfers the container in the substrate warehouse; and a substrate transfer mechanism which transfers the substrate between the functional part and the container mounted on the delivery part.

11 Claims, 7 Drawing Sheets

(51) Int. Cl.
*B65G 1/137* (2006.01)
*B08B 1/00* (2006.01)
*H01L 21/02* (2006.01)
*B65G 1/04* (2006.01)

(56) References Cited

U.S. PATENT DOCUMENTS

| | | | | |
|---|---|---|---|---|
| 8,702,365 B2* | 4/2014 | Park | .................. | H01L 21/67775 414/217 |
| 8,851,819 B2* | 10/2014 | Kamikawa | ........ | H01L 21/67775 414/281 |
| 8,882,433 B2* | 11/2014 | Bonora | ............. | H01L 21/67733 414/331.03 |
| 8,944,739 B2* | 2/2015 | Chen | ................ | H01L 21/67775 414/217 |
| 8,985,937 B2* | 3/2015 | Fukutomi | ......... | H01L 21/67775 414/805 |
| 9,698,036 B2* | 7/2017 | Aguilar | ............. | H01L 21/67733 |
| 10,153,189 B2* | 12/2018 | Takai | ................ | H01L 21/67736 |
| 10,529,607 B2* | 1/2020 | Ito | ..................... | H01L 21/67706 |
| 10,882,151 B2* | 1/2021 | Yoshida | ................. | B23Q 1/66 |
| 2002/0009357 A1* | 1/2002 | Hanson | ............. | H01L 21/67769 414/639 |
| 2003/0178142 A1* | 9/2003 | de Ridder | ......... | H01L 21/67769 156/345.31 |
| 2008/0075562 A1* | 3/2008 | Maria De Ridder | ........................ | H01L 21/67769 414/217 |
| 2010/0102030 A1* | 4/2010 | Kondoh | ............ | H01L 21/67778 216/58 |
| 2014/0234058 A1* | 8/2014 | Murata | ............. | H01L 21/67265 414/222.01 |
| 2014/0286733 A1* | 9/2014 | Ogura | ................ | H01L 21/67775 414/217.1 |
| 2014/0350713 A1* | 11/2014 | Kimura | ............. | H01L 21/68707 700/213 |
| 2014/0350714 A1* | 11/2014 | Kimura | .................... | B25J 9/042 700/213 |
| 2015/0110585 A1* | 4/2015 | Ota | .................... | H01L 21/67766 414/222.13 |
| 2016/0035607 A1* | 2/2016 | Lee | .................... | H01L 21/67769 414/304 |
| 2016/0172225 A1* | 6/2016 | Morikawa | ......... | H01L 21/67775 73/865.8 |
| 2020/0111694 A1* | 4/2020 | Mori | ................. | H01L 21/67769 |
| 2020/0350193 A1* | 11/2020 | Garssen | ............ | H01L 21/67769 |
| 2021/0098275 A1* | 4/2021 | Li | ........................ | B65D 81/022 |
| 2021/0111053 A1* | 4/2021 | de Ridder | ......... | H01L 21/67259 |

FOREIGN PATENT DOCUMENTS

| | | | |
|---|---|---|---|
| TW | 201546968 A | * | 12/2015 |
| WO | WO-2019064876 A1 | * | 4/2019 ............. G01R 31/26 |

* cited by examiner

US 11,387,129 B2

SUBSTRATE WAREHOUSE, SUBSTRATE PROCESSING SYSTEM, AND SUBSTRATE INSPECTION METHOD

CROSS REFERENCE TO RELATED APPLICATIONS

This application is based upon and claims the benefit of priority of the prior Japanese Patent Application No. 2018-189707, filed in Japan on Oct. 5, 2018, the entire contents of which are incorporated herein by reference.

BACKGROUND OF THE INVENTION

1. Field of the Invention

This disclosure relates to a substrate warehouse, a substrate processing system, and a substrate inspection method.

2. Description of the Related Art

Japanese Patent No. 5590118 discloses an automated warehouse which stores cassettes for housing a plurality of substrates before processing or after processing. This automated warehouse includes an apparatus main body and a transfer apparatus. The apparatus main body is provided with a plurality of fixed shelves in the right-left and top-bottom directions so that the cassettes are mounted on their upper surfaces. The transfer apparatus transfers the cassette by holding a flange formed at an upper surface of the cassette. The transfer apparatus includes a vertical rail and a transfer head. The vertical rail has an upper end located near a support surface of the fixed shelf at the uppermost tier. The transfer head is a member which can ascend/descend along the vertical rail. The transfer head has a vertical arm having a length which enables the vertical arm to hold the flange of the cassette mounted on the fixed shelf at the uppermost tier.

SUMMARY OF THE INVENTION

An aspect of this disclosure is a substrate warehouse configured to store a container housing a substrate, including: a transfer-in part configured to allow the container to be mounted thereon when the container is transferred-in from an outside; a transfer-out part configured to allow the container to be mounted thereon when the container is transferred-out to the outside; a standby part configured to allow the container standing by for transfer-out to the outside to be mounted thereon; a functional part including an inspection part, the inspection part being configured to perform processing of inspecting the substrate; a delivery part configured to allow the container to be mounted thereon when delivering the substrate between the functional part and the container; a container transfer mechanism configured to transfer the container in the substrate warehouse; and a substrate transfer mechanism configured to transfer the substrate between the functional part and the container mounted on the delivery part.

DETAILED DESCRIPTION OF THE INVENTION

Figure 1:
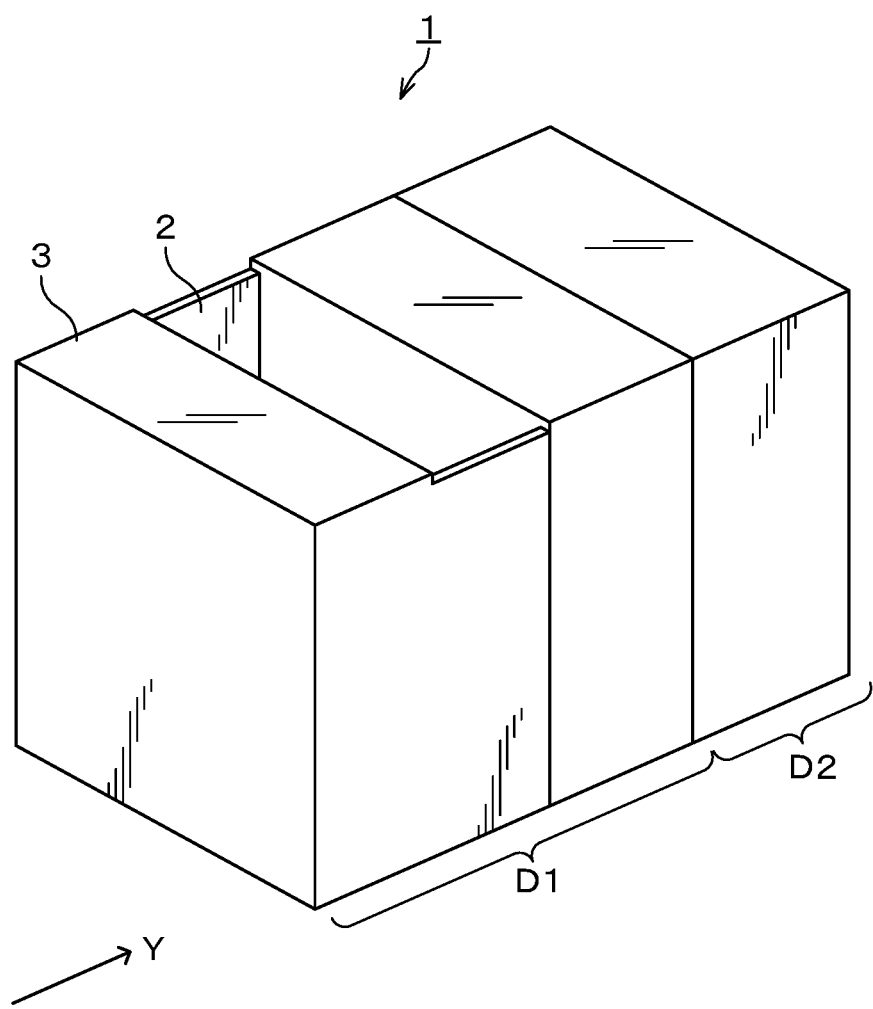
FIG. 1 is a perspective view schematically illustrating the outline of the configuration of a substrate warehouse according to this embodiment.

Various semiconductor manufacturing apparatuses such as a coating and developing apparatus which forms a desired resist pattern on a semiconductor wafer (hereinafter, referred to as a "wafer"), an etching apparatus which etches the wafer, and so on are used for manufacture of a semiconductor device. The transfer of the wafer between the semiconductor manufacturing apparatuses is performed in a unit of cassette in which wafers are housed. Further, because the time required for processing differs for each apparatus or the like, a substrate warehouse which stores cassettes housing wafers is provided in a semiconductor device manufacturing factory (refer to, for example, Japanese Patent No. 5590118).

Incidentally, great many steps are required for the manufacture of the semiconductor device. Therefore, even if it is turned out that the semiconductor device is defective in electrical characteristic inspection performed after completion of the semiconductor device, it is almost impossible to determine the cause of the defect (at which step a problem exists).

Accordingly, in the process of the manufacture of the semiconductor device, it is required to frequently inspect the wafer. However, if an inspection apparatus which inspects the wafer is provided as a single body separately from the semiconductor manufacturing apparatus such as the coating and developing treatment apparatus, a limited space in the semiconductor device manufacturing factory is reduced, resulting in a reduction in productivity. In this regard, there is no disclosure nor suggestion in Japanese Patent No. 5590118.

Hence, the technique relating to this disclosure specifies the cause of the defect during the manufacture of the semiconductor device while suppressing the reduction in productivity.

Hereinafter, a substrate warehouse, a substrate processing system, and an inspection method according to an embodiment will be explained referring to the drawings. Note that, in the description and the drawings, the same codes are given to components having substantially the same functional configurations to omit duplicated explanation.

FIG. 1 is a perspective view schematically illustrating the outline of the configuration of a substrate warehouse 1 according to this embodiment.

The substrate warehouse 1 in the drawing is to store cassettes C (refer to FIG. 2 and the like) each of which is a container housing wafers as substrates. The substrate warehouse 1 includes an accommodation block D1 and a functional block D2 as a functional part, and is configured so that the blocks D1, D2 are connected to continue in a front-rear direction (a Y-direction in the drawing).

The accommodation block D1 is formed with an accommodation space for the cassettes C and has, at an upper portion, an opening 2 being a transfer-in/out port for the cassette C of the substrate warehouse 1. Further, the accommodation block D1 has an outer wall panel 3 constituting an outer wall on a front side (on a Y-direction negative direction side in the drawing) of the accommodation block D1.

The functional block D2 is to perform the inspection and processing relating to the inspection on the wafers housed in the cassettes C in the accommodation block D1, and has an inspection module 100 (refer to FIG. 6) and the like.

In the inspection method according to this embodiment, the wafers in the substrate warehouse 1 are stored in a unit of the cassette C until the wafers are next transferred to the semiconductor manufacturing apparatus or another substrate warehouse, and inspection and so on of the wafers in the cassette C are performed during the storage using the inspection apparatus provided in the substrate warehouse 1.

Figure 2:
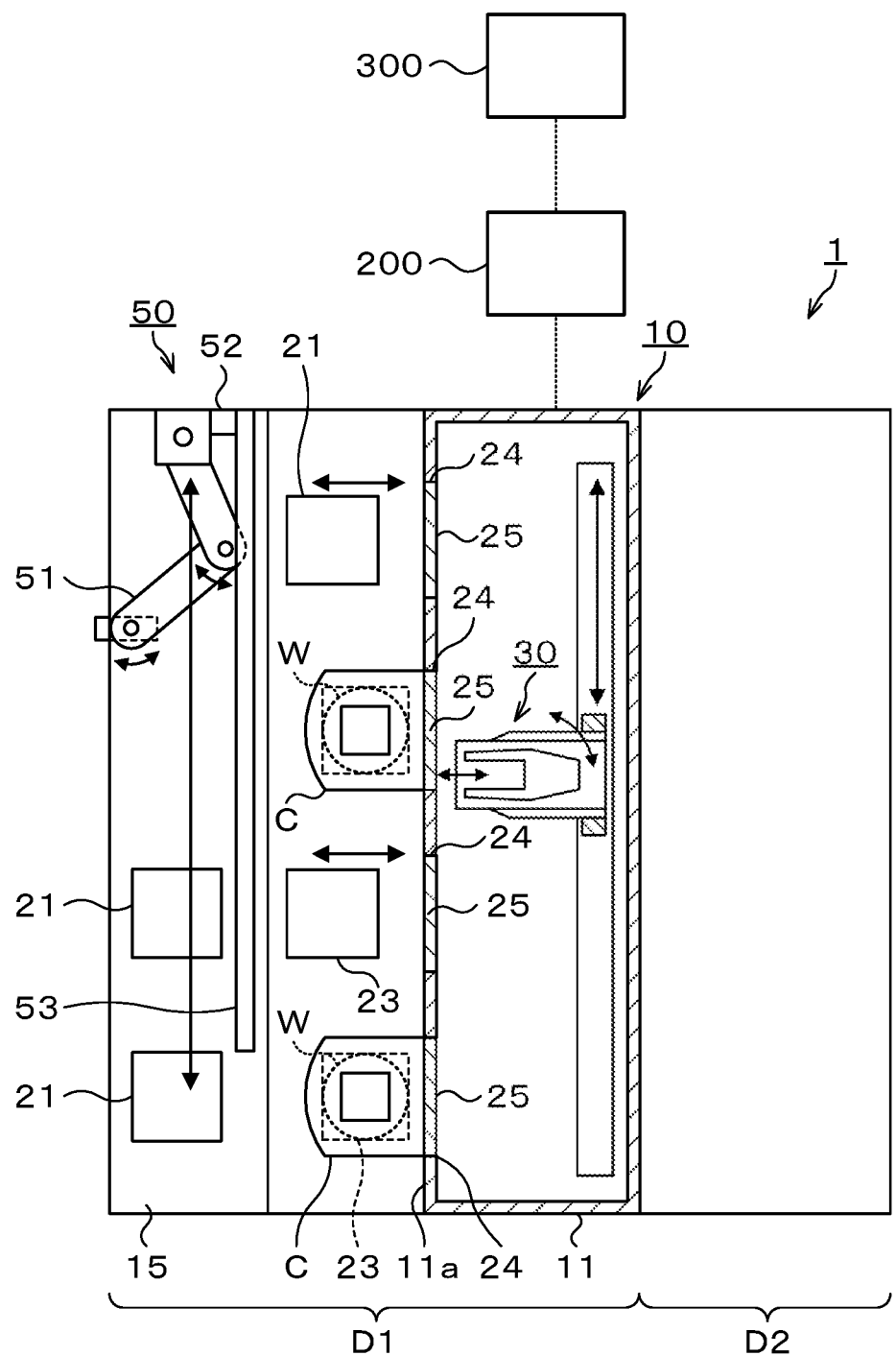
FIG. 2 is a plan view illustrating the outline of an internal configuration of the substrate warehouse according to this embodiment.
Figure 3:
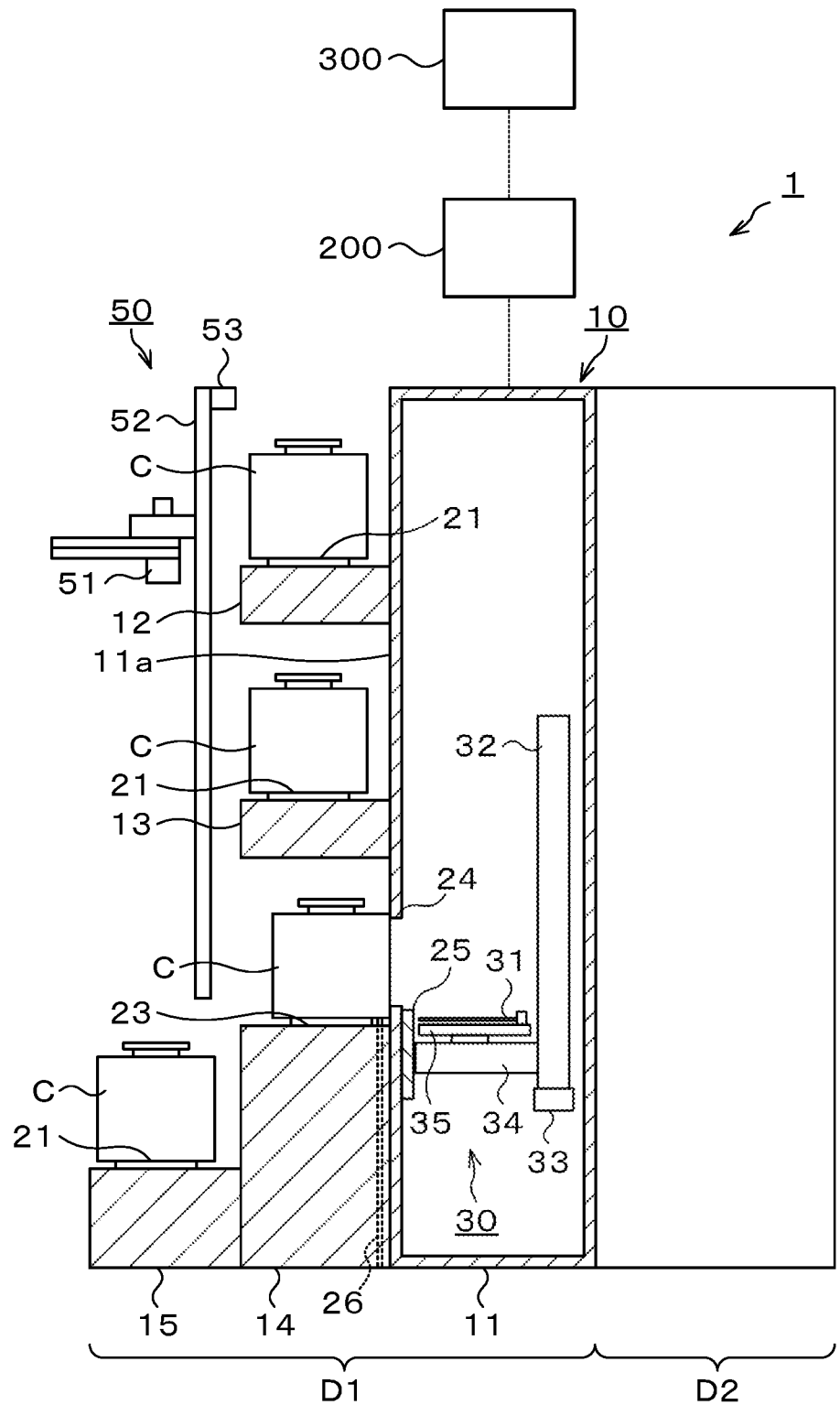
FIG. 3 is a side view illustrating the outline of the internal configuration of the substrate warehouse according to this embodiment.
Figure 4:
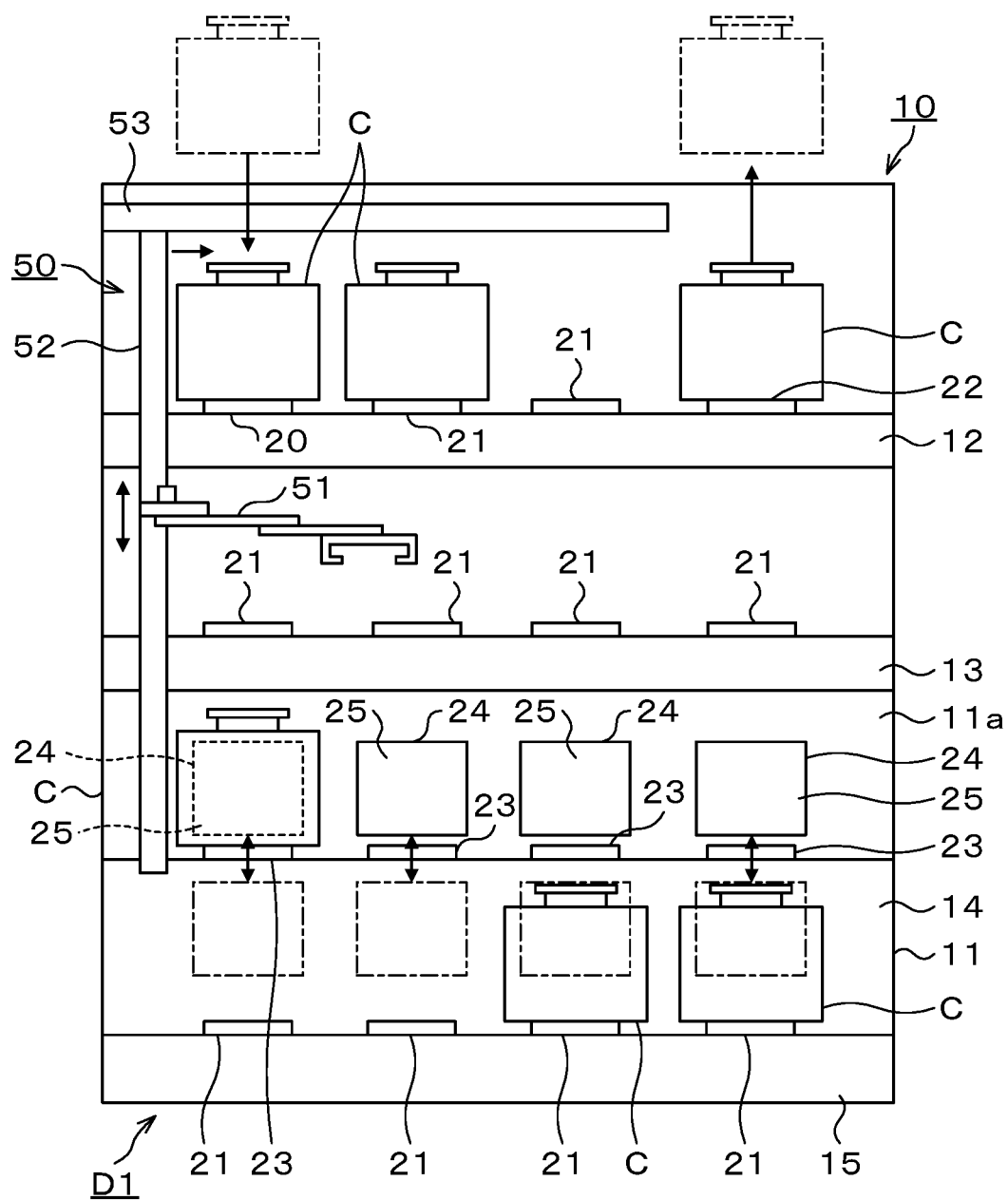
FIG. 4 is a front view illustrating the outline of an internal configuration of an accommodation block.
Figure 5:
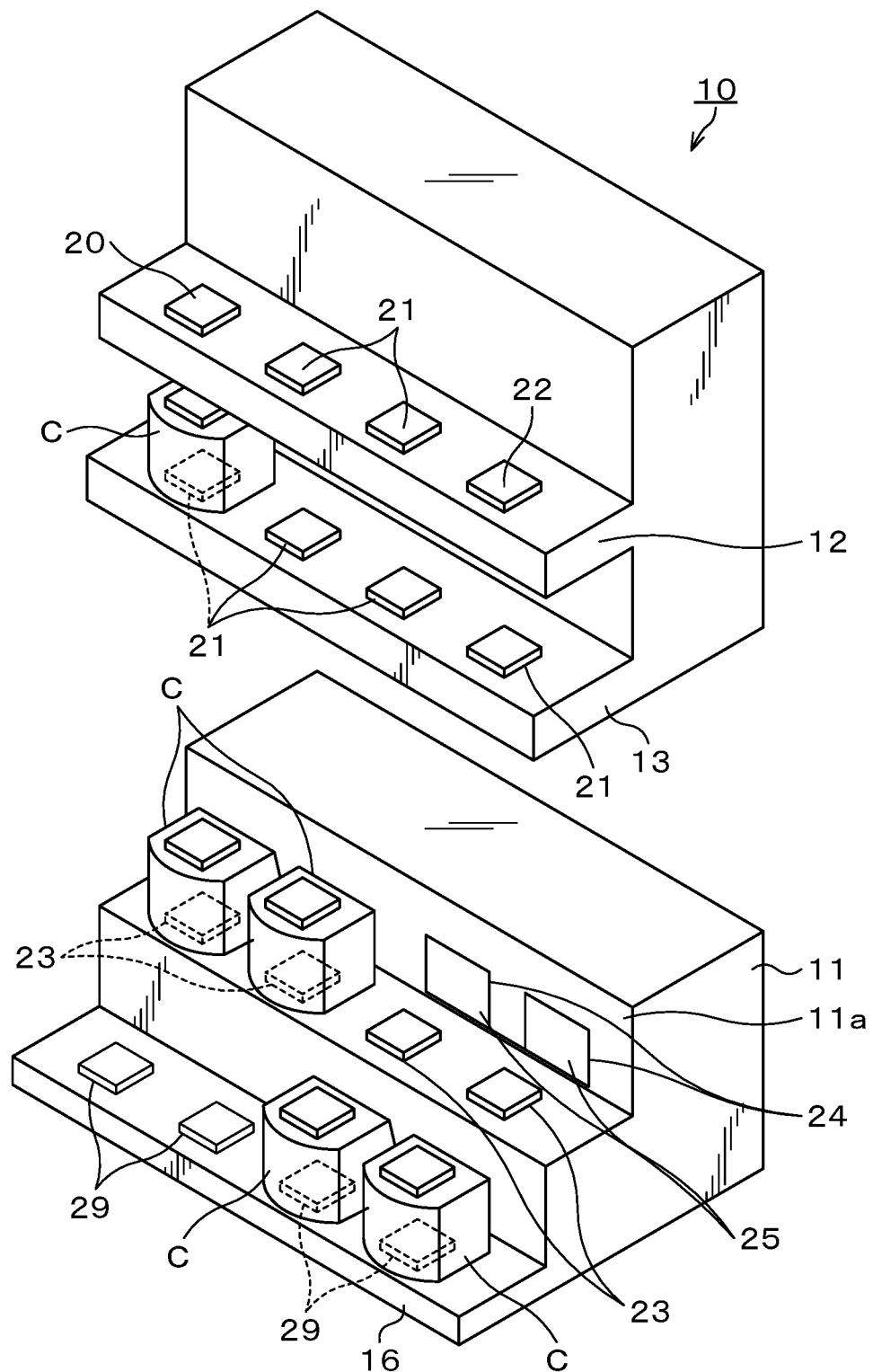
FIG. 5 is a perspective view illustrating the outline of the internal configuration of the accommodation block.
Figure 6:
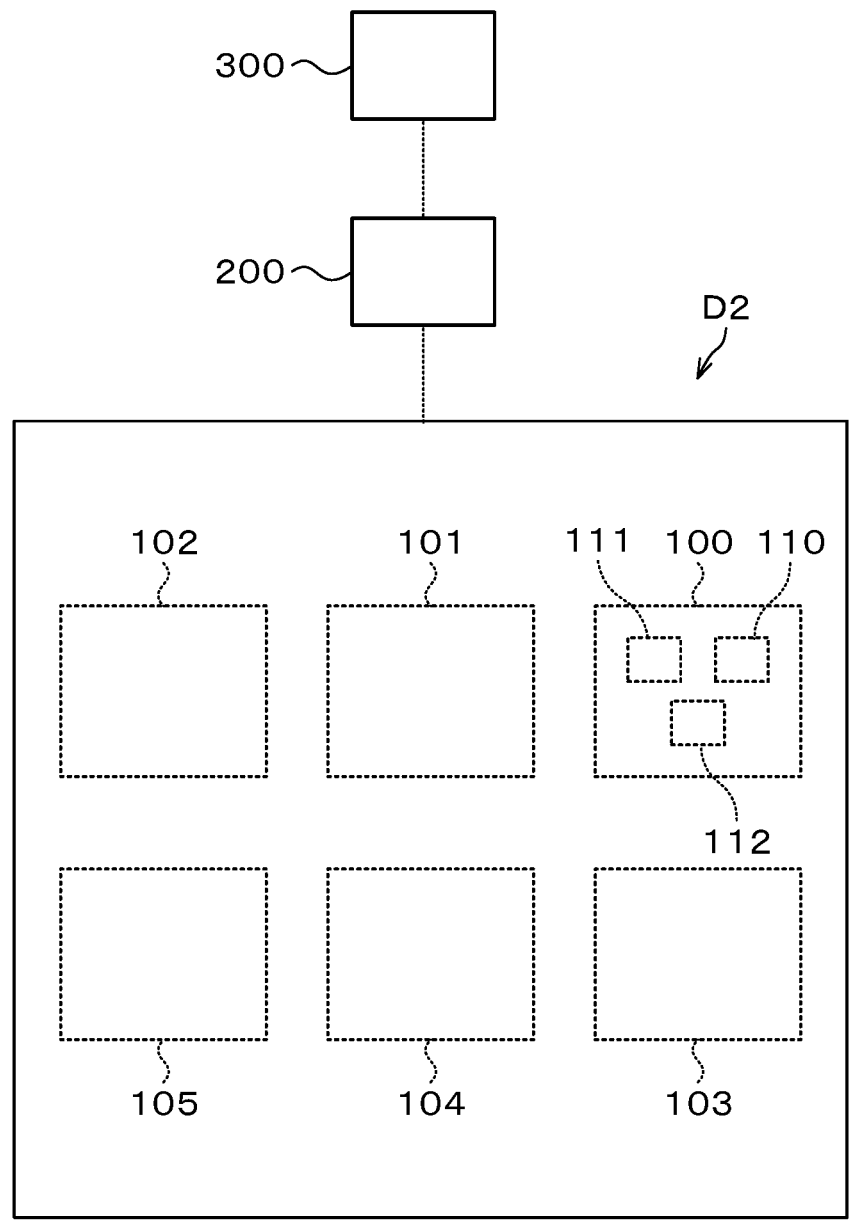
FIG. 6 is a block diagram illustrating the outline of a functional block.

FIG. 2 and FIG. 3 are a plan view and a side view illustrating the outline of an internal configuration of the substrate warehouse 1. FIG. 4 and FIG. 5 are a front view and a perspective view illustrating the outline of an internal configuration of the accommodation block D1. FIG. 6 is a block diagram illustrating the outline of the functional block D2. Note that the illustration of the outer wall panel 3 is omitted in FIG. 2 to FIG. 5, and a part of the accommodation block D1 is illustrated in section in FIG. 2 and FIG. 3. Further, in FIG. 5, a later-described shelf 10 in the accommodation block D1 is divided into upper and lower halves. Hereinafter, explanation will be made with the accommodation block D1 side regarded as a front side and the functional block D2 side regarded as a rear side, and the left side and the right side in the explanation mean the left side and the right side when viewing the accommodation block D1 from the front to the rear.

First, the accommodation block D1 will be explained.

The accommodation block D1 includes, as illustrated in FIG. 2 and FIG. 3, the shelf 10 on which the cassettes C housing the wafers W are mounted, and a cassette transfer mechanism 50 as a container transfer mechanism which transfers the cassette C in the accommodation block D1, namely, in the substrate warehouse 1.

The shelf 10 has, as illustrated in FIG. 2 to FIG. 5, a main body part 11 and shelf plate parts 12 to 15.

The main body part 11 is formed in a square tube shape, and each of side walls constituting the main body part 11 is formed vertically.

The shelf plate parts 12 to 14 are separated from each other in an up-down direction, and are formed to protrude to the front side at the same degree from a front side wall 11a of the main body part 11. Further, the shelf plate part 15 is formed to protrude to the front side from the lower end portion of the shelf plate part 14 located on the lowest side of the shelf plate parts 12 to 14. Further, the shelf plate parts 12 to 15 are formed so that their upper surfaces are horizontal to be able to support the cassettes C on the upper surfaces.

On the upper surface of the shelf plate part 12, a transfer-in stage 20 as a transfer-in part, a standby stage 21 as a standby part, a standby stage 21, and a transfer-out stage 22 as a transfer-out part on which the cassettes C are mounted are provided in this order from left to right in a line at intervals. The transfer-in stage 20 is a stage on which the cassette C is mounted when the cassette C is transferred into the accommodation block D1 by an external transfer mechanism (not illustrated) provided outside the substrate warehouse 1. Besides, the transfer-out stage 22 is a stage on which the cassette C is mounted when the cassette C is transferred out of the accommodation block D1 by the external transfer mechanism. The standby stage 21 is a stage for making the cassette C before being transferred out of the accommodation block D1 stand by thereon.

Further, a plurality of (four in the example of the drawing) aforementioned standby stages 21 are provided in a line at intervals along a right-left direction on each of the upper surfaces of the shelf plate part 13 and the shelf plate part 15.

Further, on the upper surface of the shelf plate part 14, a plurality of (four in the example of the drawing) movable stages 23 as delivery parts on which the cassettes C are mounted are provided in a line at intervals along the right-left direction. At a portion behind each of the movable stages 23 in the front side wall 11a of the main body part 11, an opening part 24 through which the wafer W passes is provided. The movable stage 23 moves between a front position where the cassette C is delivered from/to the movable stage 23 and a rear position where the wafer W is delivered between the cassette C and the inside of the main body part 11 through the opening part 24.

An ascending/descending door 25 is provided at each of the opening parts 24. At a front surface of the ascending/descending door 25, a holding mechanism (not illustrated) which holds a lid of the cassette C is provided. The holding mechanism delivers the lid to/from a container main body constituting the cassette C on the movable stage 23 at the above-explained rear position. Further, the ascending/descending door 25 moves between a closed position to close the opening part 24 and an open position to open the opening part 24. The open position is provided, for example, behind and below the closed position.

Further, the shelf plate part 14 is provided with a gas supply path 26 which supplies an inert gas such as a nitrogen gas into the cassette C. The gas supply path 26 has, for example, one end communicating with the inside of the cassette C on the movable stage 23 moved to the aforementioned rear position and another end communicating with an inert gas supply source (not illustrated).

Here, the cassette transfer mechanism 50 will be explained.

The cassette transfer mechanism 50 is provided, as illustrated in FIG. 2, in front of the front side wall 11a of the main body part 11 of the accommodation block D1. The cassette transfer mechanism 50 includes an articulated arm 51 configured to be able to hold a held part formed at an upper portion of the cassette C, an up-down moving mechanism 52 which moves the articulated arm 51 up and down, and a right-left moving mechanism 53 which moves the up-down moving mechanism 52 to the right and left.

The cassette transfer mechanism 50 transfers the cassette C from the transfer-in stage 20 to the standby stage 21 and transfers the cassette C from the standby stage 21 to the transfer-out stage 22. The cassette transfer mechanism 50 further transfers the cassette C from the transfer-in stage 20 to the movable stage 23 and transfers the cassette C from the movable stage 23 to the transfer-out stage 22. The cassette transfer mechanism 50 can transfer the cassette C between the standby stage 21 and the movable stage 23.

The explanation is returned to that of the shelf 10.

Inside the main body part 11 of the shelf 10, as illustrated in FIG. 3, a substrate transfer mechanism 30 is provided. The substrate transfer mechanism 30 includes a fork 31 which supports a rear surface of the wafer W, a frame 32 which extends in an up-down direction, a right-left moving mechanism 33 which moves the frame 32 to the right and left, an ascending/descending table 34 which ascends/descends along the frame 32, and a base 35 which is rotatable around a vertical axis on the ascending/descending table 34. The fork 31 is provided to be movable back and forth on the base 35.

The substrate transfer mechanism 30 transfers the wafer W so as to deliver the wafer W between the cassette C and the functional block D2. More specifically, the substrate transfer mechanism 30 transfers the wafer W so as to deliver the wafer W between the cassette C on the movable stage 23 moved to the aforementioned rear position and each module such as the later-explained inspection module 100 provided in the functional block D2. Further, the substrate transfer mechanism 30 transfers the wafer W so as to deliver the wafer W between the modules provided in the functional block D2. Furthermore, the substrate transfer mechanism 30 can also transfer the wafer W so as to deliver the wafer W between the cassette C on a movable stage 23 and the cassette C on another movable stage 23. Moreover, the substrate transfer mechanism 30 can also transfer the wafer W so as to move the wafer W to another slot in the same cassette C on the movable stage 23.

Subsequently, the functional block D2 will be explained.

The functional block D2 has, for example, the inspection module 100 as an inspection part. The functional block D2 further has a processing module which performs processing relating to the inspection and, more specifically, an inverting module 101, a front surface cleaning module 102, a rear surface cleaning module 103, a peripheral edge cleaning module 104, and a peripheral edge polishing module 105.

The inspection module 100 is to inspect the wafer W, and is configured as with, for example, the inspection unit disclosed in Japanese Patent Laid-open Publication No. 2017-152443 or the like. The inspection module 100 includes a rotary holder 110 which rotatably holds the wafer W, an imager 111 which images the wafer W for the inspection, and a sensing part 112 which senses a notch as a reference place being a reference of the orientation of the wafer W. An imaging result in the imager 111 and a sensing result in the sensing part 112 are outputted to a later-explained controller 200.

Note that the imager 111 may include not only a unit which images of an upper surface of the wafer W but also a unit which images a peripheral edge portion and a side end surface of the upper surface of the wafer W and a unit which images a lower surface of the wafer W. The sensing part 112 includes, for example, a light emitter which is composed of an LED (Light Emitting Diode) or the like provided at a position opposing the front surface side of the peripheral edge portion of the wafer W, and a light receiver which is composed of a PD (Photodiode) or the like provided at a position opposing the light emitter and a rear surface side of the peripheral edge portion of the wafer W. The sensing part 112 detects the notch of the wafer W on the basis of a change in amount of light incident on the light receiver. Note that the detection of the reference place such as the notch may be performed based on the imaging result in the imager 111.

The inverting module 101 as an inverter performs processing of inverting the upper and lower surfaces of the wafer (inverting processing) before the inspection by the inspection module 100 and/or after the inspection by the inspection module 100. The inverting processing is performed, for example, on a wafer which may have a flaw or the like on the front surface such as an inspection wafer.

The front surface cleaning module 102 as a front surface cleaner performs processing of cleaning the front surface of the wafer (front surface cleaning processing) before the inspection by the inspection module 100 and/or after the inspection by the inspection module 100.

The rear surface cleaning module 103 as a rear surface cleaner performs processing of cleaning the rear surface of the wafer (rear surface cleaning processing) before the inspection by the inspection module 100 and/or after the inspection by the inspection module 100.

The peripheral edge cleaning module 104 as a peripheral edge cleaner performs processing of cleaning the peripheral edge portion of the wafer (peripheral edge cleaning processing) before the inspection by the inspection module 100 and/or after the inspection by the inspection module 100.

The peripheral edge polishing module 105 as a peripheral edge polisher performs processing of polishing the peripheral edge portion of the wafer (peripheral edge polishing processing) before the inspection by the inspection module 100 and/or after the inspection by the inspection module 100.

The inverting processing, the front surface cleaning processing, the rear surface cleaning processing, the peripheral edge cleaning processing, and the peripheral edge polishing processing may be performed after the inspection according to the inspection result.

In the functional block D2, a reading processing module which performs processing of reading identification information on the wafer W written on the rear surface of the wafer W may be provided.

In the substrate warehouse 1 having the above components, the controller 200 is provided as illustrated in FIG. 2 and FIG. 3. The controller 200 is, for example, a computer which has a processor and a storage (not illustrated). In the storage, a program which controls the processing in the substrate warehouse 1 is stored and various kinds of information are stored. Further, in the storage, a program is also stored which controls the operation of the drive system of the above various modules and transfer mechanisms and so on to realize the inspection processing and so on in the substrate warehouse 1. Note that the above program may be the one recorded on a computer-readable storage medium and installed from the storage medium into the controller 200.

Note that in the substrate warehouse 1, processing other than the above-explained inverting processing, front surface cleaning processing, rear surface cleaning processing, peripheral edge cleaning processing, and peripheral edge polishing processing can be performed under the control of the controller 200.

For example, in the substrate warehouse 1, the controller 200 can control the rotary holder 110 of the inspection module 100 based on the sensing result in the inspection part 112 of the inspection module 100 to perform processing of adjusting the orientation of the wafer W (wafer orientation adjustment processing). In the wafer orientation adjustment processing, the wafer W in the cassette C on the movable stage 23 is set to a predetermined orientation and, more specifically, all of the wafers W in the cassette C are set to the same orientation, or some or all of the wafers W in the cassette C are set to different orientations from one another.

Further, in the substrate warehouse 1, the controller 200 can control the substrate transfer mechanism 30 to perform processing of gathering the wafers W in two cassettes C on the movable stages 23 into one cassette C. Further, in the substrate warehouse 1, the controller 200 can control the substrate transfer mechanism 30 and control the inspection module 100 as necessary to replace or change accommodation positions (accommodation slots) for the wafers W in the same cassette C.

The kind of the processing executable in the substrate warehouse 1 may be stored in the controller 200, and the time required for the processing may be stored for each processing.

The controller 200 is connected to a host computer 300 as a main control apparatus which collectively manages the substrate warehouse 1 and another substrate warehouse and the semiconductor manufacturing apparatuses such as the coating and developing treatment apparatus.

Next, a transfer-in step, an inspection step, and a transfer-out step performed in the substrate warehouse 1 configured as above will be explained.

(Transfer-in Step)

In the transfer-in of the cassette C, the controller 200 receives information that the cassette C will be mounted on the transfer-in stage 20 in a lapse of X seconds and the identification information on the cassette C from the host computer 300. Based on the received information, the controller 200 controls the cassette transfer mechanism 50 to hold the cassette C mounted on the transfer-in stage 20 after a lapse of X seconds by the articulated arm 51. Then, the controller 200 controls the cassette transfer mechanism 50 to transfer the cassette C, for example, to a vacant standby stage 21. The controller 200 further stores the identification information on the cassette C and the identification information on the standby stage 21 at the transfer destination in association.

(Processing Step)

For example, when there is a vacant movable stage 23, the controller 200 transmits the identification information on the cassette C mounted on the standby stage 21 to the host computer. In this event, the controller 200 transmits identification information on each processing (the inspection processing, the inverting processing or the like) executable in the substrate warehouse 1 and information on the time required for each processing to the host computer 300. Since the host computer 300 decides the cassette C to be processed and the processing to be executed this time in the substrate warehouse 1 based on the information received from the controller 200, the controller 200 receives the identification information on the cassette C and on the processing from the host computer 300. Note that the host computer 300 decides a plurality of kinds of processing as the processing to be executed in some cases.

The controller 200 then controls, based on the information received from the host computer 300, the cassette transfer mechanism 50 to transfer the cassette C from the standby stage 21 on which the cassette C to be processed this time to the movable stage 23.

The controller 200 then controls each part so that the processing to be executed is executed. For example, when the processing to be executed is only the inspection processing, the movable stage 23 is moved first from the aforementioned front position to the aforementioned rear position under the control of the controller 200. Thereafter, the ascending/descending door 25 moves from the aforementioned closed position to the open position, whereby the opening part 24 is opened and the lid of the cassette C on the movable stage 23 is opened. Subsequently, the wafer W is taken out of the cassette C by the substrate transfer mechanism 30 and transferred to the inspection module 100.

The wafer is then inspected by the inspection module 100. Specifically, the imager 111 of the inspection module 100 images the wafer W, an imaging result is outputted to the controller 200, and the controller 200 generates a captured image for inspection based on the imaging result. Thereafter, the controller 200 inspects the presence/absence of a defect based on the image for inspection, and transmits the captured image for inspection and the inspection result to the host computer 300.

After the inspection in the inspection module 100, the wafer W is returned by the substrate transfer mechanism 30 from the inspection module 100 to the original cassette C.

Thereafter, the above-explained steps are repeated until the inspection by the inspection module 100 on all of the wafers W in the cassette C is finished.

Upon finish of the inspection on all of the wafers W, the ascending/descending door 25 moves from the aforementioned open position to the aforementioned the closed position, whereby the opening part 24 is closed and the lid of the cassette C on the movable stage 23 is closed. Then, the movable stage 23 moves from the rear position to the front position, and then the cassette transfer mechanism 50 transfers the cassette C on the movable stage 23 to a vacant standby stage 21. In this event, the controller 200 stores the identification information on the cassette C and the identification information on the standby stage 21 at the transfer destination in association.

(Transfer-Out Step)

In the transfer-out of the cassette C, the controller 200 receives information that the cassette C will be transferred out from the transfer-out stage 22 in a lapse of Y seconds and the identification information on the cassette C from the host computer 300. Based on the received identification information on the cassette C and the identification information on the standby stage 21 stored in association with the identification information on the cassette C, the controller 200 controls the cassette transfer mechanism 50 to hold the cassette C mounted on the standby stage 21 by the articulated arm 51. Then, the controller 200 controls the cassette transfer mechanism 50 to transfer the cassette C, for example, to the transfer-out stage 22 before the lapse of the Y seconds.

The following effects are provided according to this embodiment.

The substrate warehouse is necessarily provided in a mass production factory for semiconductor devices since the throughputs of the semiconductor manufacturing apparatuses are not the same, and the inspection module 100 is provided in the substrate warehouse 1 in this embodiment. Accordingly, it is possible to suppress the reduction of the space in the mass production factory for semiconductor devices due to the space for inspection as compared with the case of providing the inspection apparatus as a single body separately from the semiconductor manufacturing apparatuses and the substrate warehouse, thereby suppressing the reduction in productivity. Further, the provision of the inspection module 100 as explained above makes it possible to frequently inspect the wafer W in the process of the manufacture of the semiconductor devices, thereby specifying the cause of the defect during the manufacture of the semiconductor devices. Further, the provision of the inspection module 100 in the substrate warehouse 1 makes it possible to use the standby time of the cassette C in the substrate warehouse 1, namely, the standby time of the wafer W for the inspection, thereby effectively utilizing the standby time.

Further, according to this embodiment, since the processing other than the inspection processing can also be executed, the standby time can be further effectively utilized.

Furthermore, in this embodiment, since the inspection is performed based on the imaging result in the imager 111 of the inspection module 100 during the standby time, the inspection can be performed on many wafers W without decreasing the throughput.

In the above example, the controller 200 decides the cassette C to be processed (the cassette C as a processing target) based on the identification information on the cassette C to be processed received from the host computer 300 in the above example. In place of this, the controller 200 may acquire information on the time during which the processing is allowed to be executed on the cassette C (allowed time) for each cassette C from the host computer 300, and decide the cassette C as the processing target based on the information. For example, the cassette C for which the allowed time is shortest within a range of the time during which the processing can be completed, may be decided as the processing target.

Further, in the above example, the controller 200 decides the processing to be executed based on the identification information on the processing to be executed received from the host computer 300. In place of this, the controller 200 may decide the processing to be executed based on the information on the allowed time and on the information related to the time required for each processing. Further, the controller 200 may receive information on the priority of processing from the host computer 300 in addition to the information on the allowed time and the information related to the time required for each processing, and decide the processing to be executed, based on the information.

Note that in the case where there is no information about the processing to be executed from the host computer 300 or the like, predetermined processing may be executed.

In the above example, when there is a vacant movable stage 23, the controller 200 transmits the identification information on each processing executable in the substrate warehouse 1 and the information on the time required for each processing to the host computer 300. The transmission timing of the information is not limited to the above, but the information may be transmitted, for example, in advance.

Though the processing to be executed is common among the plurality of wafers W housed in the same cassette C in the above example, but the processing to be executed may be made different.

Figure 7:
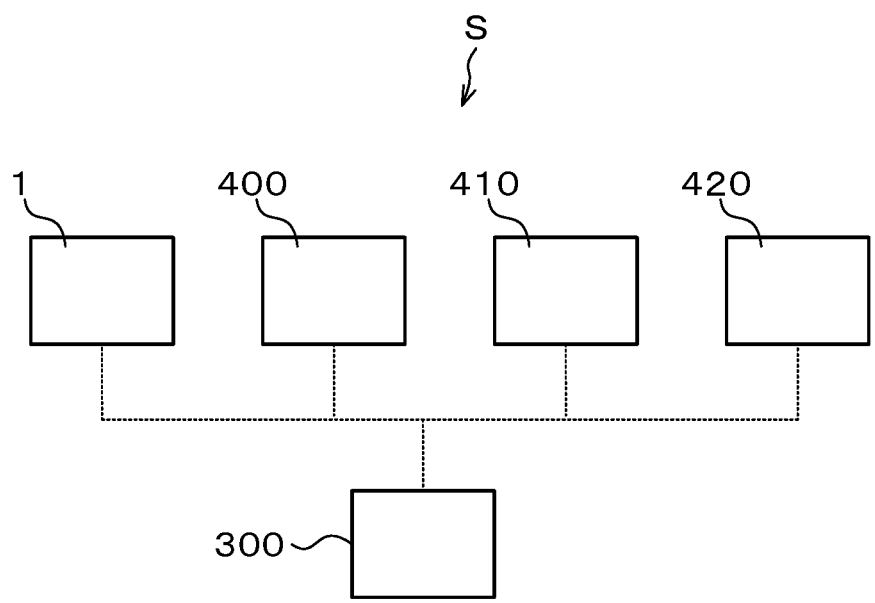
FIG. 7 is an explanatory view illustrating the outline of a substrate processing system according to another embodiment.

FIG. 7 is an explanatory view illustrating the outline of a substrate processing system according to another embodiment.

The technique according to this disclosure can take a form of a substrate processing system S as illustrated in FIG. 7. The substrate processing system S includes the aforementioned substrate warehouse 1, a coating and developing treatment apparatus 400, an etching apparatus 410, and a film forming apparatus 420 as processing apparatuses, and a host computer 300.

In the above example, the processing modules such as the inverting module 101 and so on other than the inspection module 100 are provided in the functional block D2 of the substrate warehouse 1. However, the processing modules other than the inspection module 100 may be omitted.

Further, the number of each of the processing modules such as the inspection module 100 is one in the above example, but may be plural.

Note that the substrate warehouse 1 may store not only the cassette C housing the wafers W for mass production but also the cassette C housing inspection wafers.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

Note that the following configurations also belong to the technical scope of this disclosure.

(1) A substrate warehouse configured to store a container housing a substrate, includes:

a transfer-in part configured to allow the container to be mounted thereon when the container is transferred-in from an outside;

a transfer-out part configured to allow the container to be mounted thereon when the container is transferred-out to the outside;

a standby part configured to allow the container standing by for transfer-out to the outside to be mounted thereon;

a functional part including an inspection part, the inspection part being configured to perform processing of inspecting the substrate;

a delivery part configured to allow the container to be mounted thereon when delivering the substrate between the functional part and the container;

a container transfer mechanism configured to transfer the container in the substrate warehouse; and a substrate transfer mechanism configured to transfer the substrate between the functional part and the container mounted on the delivery part.

According to the (1), the substrate warehouse necessarily provided in a mass production factory for semiconductor devices has the inspection part. Accordingly, it is possible to suppress the reduction of the space in the mass production factory due to the space for inspection, thereby suppressing the reduction in productivity for the semiconductor devices. Further, the provision of the inspection part makes it possible to frequently inspect the substrate in the process of the manufacture of the semiconductor devices, thereby specifying the cause of the defect during the manufacture of the semiconductor devices. Further, the provision of the inspection part in the substrate warehouse makes it possible to use, for the inspection, the standby time of the container in the substrate warehouse, namely, the standby time of the substrate, thereby effectively utilizing the standby time.

(2) The substrate warehouse according to the (1), wherein:

the inspection part includes a sensing part which senses a reference place being a reference for an orientation of the substrate; and the substrate warehouse includes a controller configured to control the inspection part and the substrate transfer mechanism so that processing of setting an orientation of the substrate to a predetermined orientation is executed in the container.

According to the (2), the standby time is used for the time of the processing of setting the predetermined orientation in addition to the inspection processing, thereby enabling more effective utilization of the standby time.

(3) The substrate warehouse according to the (1) or (2), wherein the functional part includes at least one of an inverter configured to perform processing of inverting front and rear surfaces of the substrate, a front surface cleaner configured to perform processing of cleaning the front surface of the substrate, a rear surface cleaner configured to perform processing of cleaning the rear surface of the substrate, a peripheral edge cleaner configured to clean a peripheral edge portion of the substrate, and a peripheral edge polisher configured to polish the peripheral edge portion of the substrate.

According to the (3), the standby time is used for the time of the inverting processing or the like in addition to the inspection processing, thereby enabling more effective utilization of the standby time.

(4) The substrate warehouse according to any one of the (1) to (3), further including:

a controller configured to control the functional part and the substrate transfer mechanism so that processing to be executed is executed based on identification information on the processing to be executed received from a main control apparatus provided outside.

(5) The substrate warehouse according to any one of the (1) to (3), further including:

a controller configured, for each container, to receive information on an allowed time during which execution of processing on the container is allowed from a main control apparatus provided outside, decide processing to be executed based on the information on the allowed time, and control the functional part and the substrate transfer mechanism so that the decided processing to be executed is executed.

(6) A substrate processing system including:

the substrate warehouse according to any one of the (1) to (5);

a processing apparatus configured to perform predetermined processing on the substrate; and a control apparatus configured to control the substrate warehouse and the processing apparatus.

(7) A substrate inspection method of inspecting a substrate, the substrate being stored in a substrate warehouse while the substrate being housed in a container, the substrate warehouse including:

a transfer-in part configured to allow the container to be mounted thereon when the container is transferred-in from an outside;

a transfer-out part configured to allow the container to be mounted thereon when the container is transferred-out to the outside;

a standby part configured to allow the container standing by for transfer-out to the outside to be mounted thereon;

a functional part including an inspection part, the inspection part being configured to perform processing of inspecting the substrate;

a delivery part configured to allow the container to be mounted thereon when delivering the substrate between the functional part and the container;

a container transfer mechanism configured to transfer the container in the substrate warehouse; and a substrate transfer mechanism configured to transfer the substrate between the functional part and the container mounted on the delivery part, the substrate inspection method including inspecting the substrate in the container in the inspection part between transfer-in of the container into the substrate warehouse and transfer-out of the container.

According to this disclosure, it is possible to specify the cause of the defect during manufacture of semiconductor devices while suppressing a reduction in productivity.

What is claimed is:

1. A substrate warehouse configured to store a container housing a substrate, comprising:

a transfer-in part configured to allow the container to be mounted thereon when the container is transferred-in from an outside;

a transfer-out part configured to allow the container to be mounted thereon when the container is transferred-out to the outside;

a standby part configured to allow the container standing by for transfer-out to the outside to be mounted thereon;

a functional part comprising an inspection part, the inspection part being configured to perform processing of inspecting the substrate;

a delivery part configured to allow the container to be mounted thereon when delivering the substrate between the functional part and the container;

a container transfer mechanism configured to transfer the container in the substrate warehouse; and a substrate transfer mechanism configured to transfer the substrate between the functional part and the container mounted on the delivery part, wherein the functional part comprises at least one of an inverter configured to perform processing of inverting front and rear surfaces of the substrate, a front surface cleaner configured to perform processing of cleaning the front surface of the substrate, a rear surface cleaner configured to perform processing of cleaning the rear surface of the substrate, a peripheral edge cleaner configured to clean a peripheral edge portion of the substrate, and a peripheral edge polisher configured to polish the peripheral edge portion of the substrate.

2. The substrate warehouse according to claim 1, wherein:

the inspection part comprises a sensing part which senses a reference place being a reference for an orientation of the substrate; and the substrate warehouse comprises a controller configured to control the inspection part and the substrate transfer mechanism so that processing of setting an orientation of the substrate to a predetermined orientation is executed in the container.

3. The substrate warehouse according to claim 2, wherein the functional part comprises at least one of an inverter configured to perform processing of inverting front and rear surfaces of the substrate, a front surface cleaner configured to perform processing of cleaning the front surface of the substrate, a rear surface cleaner configured to perform processing of cleaning the rear surface of the substrate, a peripheral edge cleaner configured to clean a peripheral edge portion of the substrate, and a peripheral edge polisher configured to polish the peripheral edge portion of the substrate.

4. The substrate warehouse according to claim 1, further comprising:

a controller configured to control the functional part and the substrate transfer mechanism so that processing to be executed is executed based on identification information on the processing to be executed received from a main control apparatus provided outside.

5. The substrate warehouse according to claim 1, further comprising:

a controller configured, for each container, to receive information on an allowed time during which execution of processing on the container is allowed from a main control apparatus provided outside, decide processing to be executed based on the information on the allowed time, and control the functional part and the substrate transfer mechanism so that the decided processing to be executed is executed.

6. A substrate processing system comprising:

the substrate warehouse according claim 1;

a processing apparatus configured to perform predetermined processing on the substrate; and a control apparatus configured to control the substrate warehouse and the processing apparatus.

7. The substrate warehouse according to claim 1, wherein the functional part comprises the inspection part and the inverter.

8. The substrate warehouse according to claim 1, wherein the functional part comprises the inspection part and the front surface cleaner.

9. The substrate warehouse according to claim 1, wherein the functional part comprises the inspection part and the rear surface cleaner.

10. The substrate warehouse according to claim 1, wherein
the functional part comprises the inspection part and the peripheral edge cleaner.

11. The substrate warehouse according to claim 1, wherein
the functional part comprises the inspection part and the peripheral edge polisher.

\* \* \* \* \*